(12) United States Patent
Subramanian et al.

(10) Patent No.: US 6,889,763 B1
(45) Date of Patent: May 10, 2005

(54) SYSTEM FOR RAPIDLY AND UNIFORMLY COOLING RESIST

(75) Inventors: Ramkumar Subramanian, San Jose, CA (US); Bharath Rangarajan, Santa Clara, CA (US); Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/707,413

(22) Filed: Nov. 6, 2000

Related U.S. Application Data
(60) Provisional application No. 60/242,626, filed on Oct. 23, 2000.

(51) Int. Cl.[7] .................................................. F25B 29/00
(52) U.S. Cl. ........................ 165/244; 361/381; 165/48.1
(58) Field of Search ........................... 165/47, 48.1, 58, 165/61, 63, 64, 264, 80.1, 80.2, 80.3, 80.4, 80.5, 244, 275; 361/381; 62/514

(56) References Cited

U.S. PATENT DOCUMENTS

| | | | |
|---|---|---|---|
| 3,602,714 A | 8/1971 | Farmer et al. | |
| 4,280,807 A | 7/1981 | Smith, Jr. et al. | |
| 4,621,279 A | 11/1986 | Maier et al. | |
| 4,652,229 A | 3/1987 | Mehnert et al. | |
| 5,003,783 A | 4/1991 | Reale | |
| 5,119,637 A | 6/1992 | Bard et al. | |
| 5,281,217 A | 1/1994 | Edwards et al. | |
| 5,709,262 A | * 1/1998 | Sikes | 165/47 |

* cited by examiner

*Primary Examiner*—Ljiljana Ciric
(74) *Attorney, Agent, or Firm*—Amin & Turocy, LLP

(57) ABSTRACT

Resist coated wafers are rapidly and uniformly cooled by a fluid that has been cooled through the Joule-Thompson effect. Fluid from a high pressure reservoir is vented into a chamber that contains the substrates. By varying the pressure difference between the reservoir and the chamber, the temperature of the cooling fluid entering the chamber can be controlled. By also controlling the flow rate through the chamber, the average temperature difference between the fluid in the chamber and the substrates may be limited, whereby more uniform cooling is obtained. While the chamber pressure is lower than that in the high pressure reservoir, the chamber pressure may still be substantially greater than atmospheric. An elevated chamber pressure raises the specific heat and residence time of the fluid in the chamber, which also promotes uniform cooling.

10 Claims, 5 Drawing Sheets

SYSTEM FOR RAPIDLY AND UNIFORMLY COOLING RESIST

CROSS REFERENCE TO RELATED APPLICATIONS

This application claims the benefit of U.S. Provisional Patent Application Ser. No. 60/242,626, filed Oct. 23, 2000, entitled SYSTEM FOR RAPIDLY AND UNIFORMLY COOLING RESIST.

TECHNICAL FIELD

The present invention relates to semiconductor processing and in particular to a system for uniformly and rapidly cooling a resist.

BACKGROUND OF THE INVENTION

In the semiconductor industry, there is a continuing trend toward higher device densities. To achieve these high densities there has been, and continues to be, efforts toward scaling down the device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution lithographic processes. In general, lithography refers to processes for pattern transfer between various media. It is a technique used for integrated circuit fabrication in which a silicon slice, the wafer, is coated uniformly with a radiation-sensitive film, the resist, and the film exposed with a radiation source (such as optical light, x-rays, or an electron beam) that illuminates selected areas of the surface through an intervening master template, the mask, forming a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. A positive-tone resist is one that becomes more soluble in the developer after exposure to actinic radiation. A negative-tone resist becomes less soluble in the developer after exposure. The more soluble areas are removed in the developing process to leave the pattern image in the coating.

A resist coating is typically prepared by dripping or spraying a resist solution onto a spinning substrate. This forms a relatively uniform coating of the resist solution, which is then "soft-baked." Soft-baking drives off solvent, improves adhesion of the resist to the substrate, and anneals stresses caused by shear forces encountered in the spinning process. Typically, the solvent level is reduced from the 20% to 30% range to about the 4% to 7% range.

The time and temperature of the soft-bake determines a number of parameters that affect subsequent processing steps. The degree of soft-baking affects the residual solvent content of the resist, which in turn affects the rate of attack of the resist by the developer. Under-baked resists may show inadequate differentiation between the dissolution rates of exposed and un-exposed regions. On the other hand, over-baking reduces photosensitivity of the resist, which also reduces the ability to create sharp contrast between exposed and unexposed regions. Consequently, the soft-bake must be carefully optimized and controlled.

Particularly where extremely fine patterns are sought, the pre-bake process must not only be controlled from substrate to substrate, but also across each individual substrate. Both the overall temperature history and variations in the temperature across the photoresist must be controlled. Variation in the temperature history across the substrate during pre-bake can lead, after exposure of the resist, to unintended lengthwise variations in the width of features such as lines and gaps. Chemically amplified photoresists are particularly susceptible to such variations. The feature sizes of chemically amplified photoresists can be drastically affected by only a few degrees difference in temperature. Line size deviations often occur unless temperature is maintained within 0.5° C. tolerance across the substrate. Temperature control within ±0.2° C. may be required.

Much attention has been given to systems for uniformly heating photoresist coated substrates. While convection ovens have been used, they have limitations. The temperature uniformity of convection ovens is not particularly good and particles may enter the ovens and become embedded in the heated resist. Infrared ovens have been widely utilized. These ovens have much shorter heating times than convection ovens (3–4 minutes versus approximately 30 minutes). Hot-plates also permit rapid heating.

Less attention has been given to cooling systems, although several have been suggested. Natural convection cooling under ambient conditions has been used, but this is relatively slow and results in substantial non-uniformities. Cold-plates are somewhat better. These can be cooled by cooling fluids or Peltier elements. However, substrate temperature gradients form when using cold plates, since heat must travel from the substrates and the surroundings to the cold plates. It has been proposed to submerge the substrates in a liquid such as water. Cooling in this case may be too rapid and cause mechanical damage to the substrate. Submerging also has the disadvantage of requiring a drying step. Use of a cooling gas has been suggested, but a cooling gas does not appear to have been successfully used to achieve uniform cooling.

Therefore, there remains an unsatisfied need for a system and method of rapidly and uniformly cooling resist coated substrates.

SUMMARY OF THE INVENTION

According to the invention, resist coated wafers are rapidly and uniformly cooled by a fluid that has been cooled through the Joule-Thompson effect. Fluid from a high pressure reservoir is vented into a chamber that contains the substrates. By varying the pressure difference between the reservoir and the chamber, the temperature of the cooling fluid entering the chamber can be controlled. By also controlling the flow rate through the chamber, the average temperature difference between the fluid in the chamber and the substrates may be limited, whereby more uniform cooling is obtained. While the chamber pressure is lower than that in the high pressure reservoir, the chamber pressure may still be substantially greater than atmospheric. An elevated chamber pressure raises the specific heat and residence time of the fluid in the chamber, which also promotes uniform cooling.

In one aspect, the invention provides a system including a chamber adapted to receive one or more coated semiconductor substrates, a coupling for placing the chamber in fluid communication with a fluid reservoir, an inlet valve controlling the flow of fluid between the fluid reservoir and the chamber, and a controller that controls the inlet valve.

In another aspect, the invention provides a system for cooling coated semiconductor substrates including means for cooling a fluid by at least about 10° C. through the Joule-Thompson effect and means for contacting the cooled fluid with the substrates.

In a further aspect, the invention provides a method of cooling coated semiconductor substrates including the steps of cooling a fluid by at least about 10° C. through the Joule-Thompson effect and contacting the substrates with the cooled fluid.

In a further aspect, the invention provides a method of cooling coated semiconductor substrates including the steps of heating a fluid to a temperature above ambient, subsequently flowing the fluid into a chamber containing the substrates, and cooling the substrates by contacting them with the fluid that has been heated.

In a further aspect, the invention provides a system for cooling coated semiconductor substrates including a first sub-system for cooling a fluid using the Joule-Thompson effect and a second subsystem for contacting the coated semiconductor substrates with the cooled fluid.

The invention extends to features hereinafter fully described and particularly pointed out in the claims. The following description and the annexed drawings set forth in detail certain illustrative examples of the invention. These examples are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
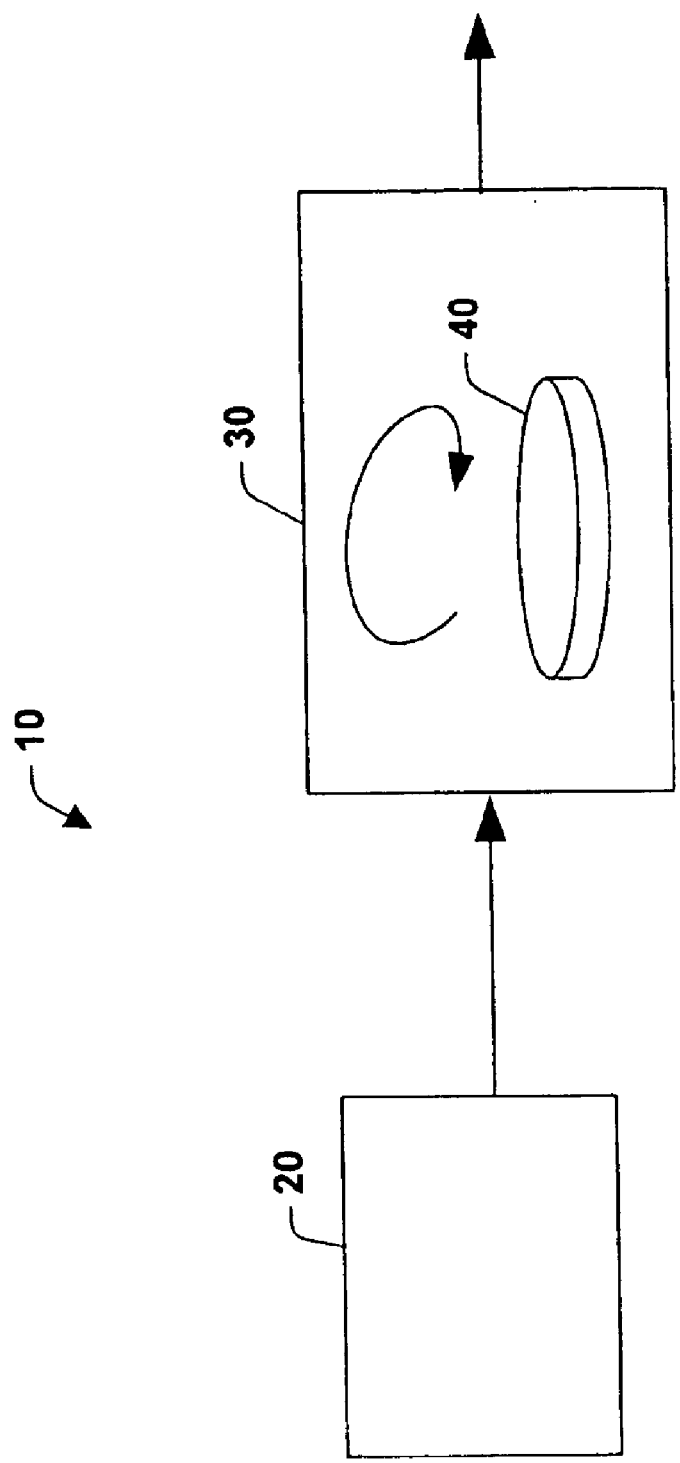
FIG. 1a is a general schematic of a system according to the present invention for cooling coated semiconductor substrates.

The present invention will now be described with reference to the drawings, wherein like reference numerals are used to refer to like elements throughout.

FIG. 1a is a general schematic of a cooling system 10 in accordance with the present invention. Cooling system 10 includes a first sub-system 20 in which a fluid is cooled through the Joule-Thompson effect and a second sub-system 30 in which the cooled fluid is contacted with one or more coated semiconductor substrates 40.

Figure 1B:
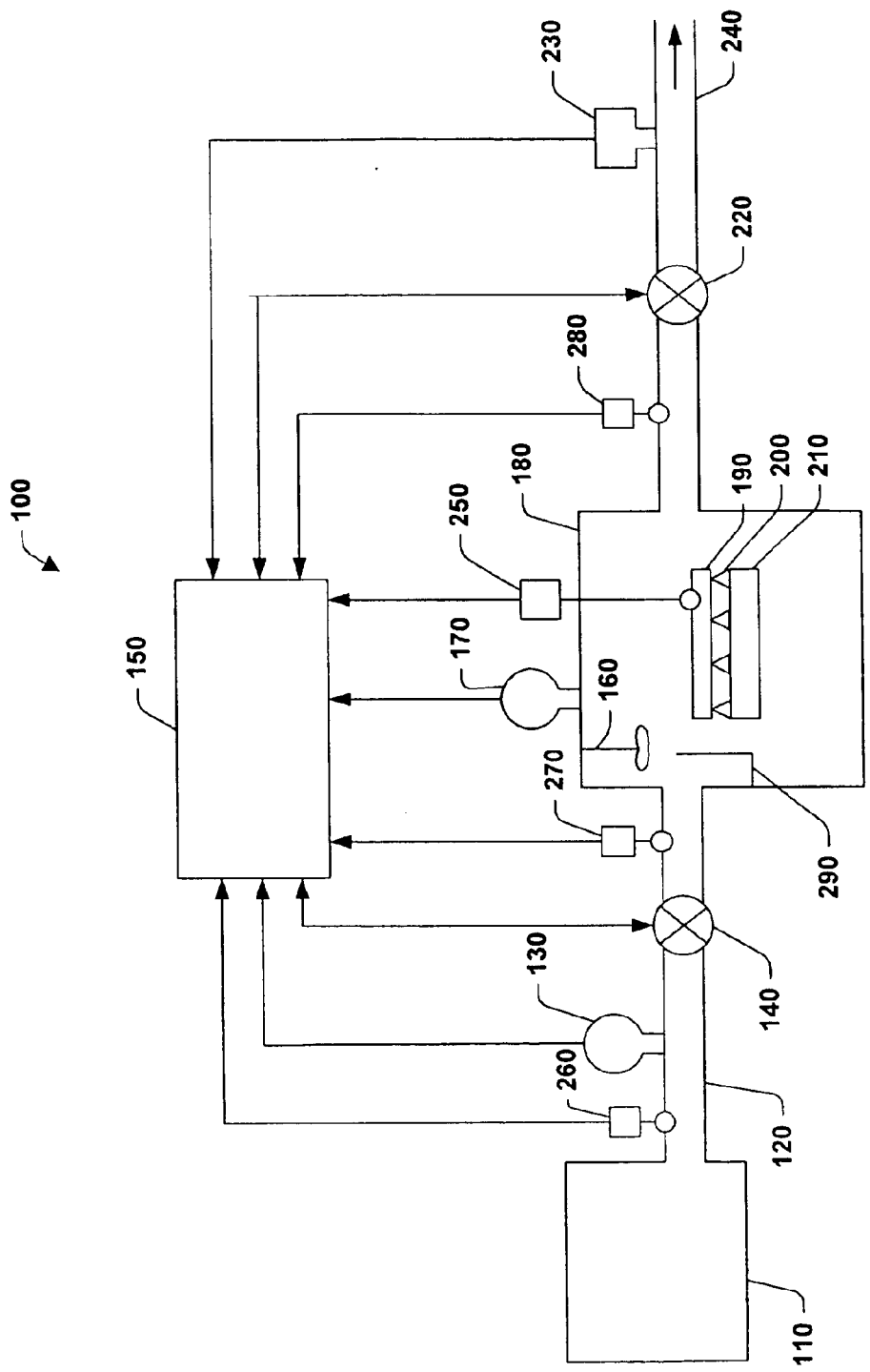
FIG. 1b is another schematic of a system according to the present invention for cooling a coated semiconductor substrate.

FIG. 1b is a schematic of a cooling system 100 in accordance with the present invention. System 100 includes high pressure reservoir 110, inlet valve 140, chamber 180, outlet valve 220, and controller 150. In accordance with a method of the present invention, one or more coated substrates 190 are cooled by venting fluid from high pressure reservoir 110 into chamber 180, which contains substrates 190. Fluid is vented into chamber 180 through inlet valve 140 and released through outlet valve 220 to exhaust 240, whereby a continuous flow of cooling fluid and constant pressure may be maintained within chamber 180. Controller 150 monitors the cooling process through substrate temperature sensor 250 and controls the process by manipulating inlet valve 140 and outlet valve 220. Additional information may be provided to controller 150 by inlet valve 140, outlet valve 220, flow meter 230, reservoir fluid temperature sensor 260, chamber inlet temperature sensor 270, and chamber exhaust temperature sensor 280. This information may be used by controller 150 to maximize the cooling rate while limiting temperature variations within and among substrates 190.

The substrates are typically semi-conducting materials, such as silicon. In addition to a semiconducting material, the substrates may include various elements and/or layers; including metal layers, barrier layers, dielectric layers, device structures, active elements and passive elements including silicon gates, word lines, source regions, drain regions, bit lines, bases emitters, collectors, conductive lines, conductive plugs, etc. Sudden temperature changes may result in delamination or detachment of the substrate coating, substrate layers, or substrate devices.

The substrate coating may be of any type. It may be liquid or solid. Generally, the coating will have properties that are sensitive to temperature. The invention is particularly useful when the coating is a resist. The resist may be organic or inorganic. It may be a photoresist responsive to visible light, ultraviolet light, or x-rays, or it may be an electron beam resist or an ion beam resist. The resist may be positive or negative tone. The resist may be chemically amplified, whereby its sensitivity to actinic radiation is enhanced.

Substrates 190 are contained in chamber 180. This chamber may be the same chamber that was used to heat the coated substrates. On the other hand, it may be a separate chamber. Using the same chamber to heat and cool the substrates has the advantages of not having to move the substrate and avoiding exposure of the substrates to uncontrolled temperature changes during the transportation process. On the other hand, using one chamber for heating and cooling increases the cooling requirement. For example system 100 includes heating plate 210. Heating plate 210 increases the cooling requirement. Substrates may be moved from a heating chamber to a cooling chamber quickly and automatically, by a robotic arm for example.

Substrates 190 are supported on pins 200 over hot plate 210. The cooling process is facilitated by ensuring hot plate 210, or whatever structure supports the substrates, has a low thermal inertia. Pins 200 reduces the risk of contamination of substrates 190 by the structure on which the substrates are supported.

Substrates 190 are cooled by venting fluid from high pressure reservoir 110 into chamber 180 through inlet valve 140. In one aspect of the invention, the pressure drop across valve 140 is at least about 1 bar. In another aspect, the pressure drop is at least about 10 bar. In a further aspect, the pressure drop is at least about 100 bar. Reservoir 110 is usually a high pressure gas cylinder, although it could be the outlet of a pump. The fluid generally cools as it is vented into chamber 180. In one aspect of the invention, it cools by at least about 10° C. In another aspect, it cools by at least about 25° C. In a further aspect, it cools by at least about 50° C.

Reservoir 100 is in fluid communication with chamber 180 through coupling 120. Coupling 120, or another part of the system, may include a means of excluding particles from the fluid stream. The means may be a filter in coupling 120 to remove particles from the fluid, or may involve providing a fluid source that is relatively free of particles. Particles in the cooling fluid may contaminate the substrates, if not controlled.

The fluid can be any fluid that exhibits the Joule-Thomson effect in the temperature range of interest and is chemically inert with respect to coated substrates 190. The Joule-Thomson effect is the cooling of a fluid upon adiabatic expansion. When a fluid expands freely from a high pressure reservoir into a lower pressure chamber, as in expansion through a valve, the process is generally, to a good approximation, adiabatic. The change of temperature can be determined from the pressure change and the formula:

$$dT/dP=(T/C_p)(\partial V/\partial T)_p - TV/C_p$$

If the expression on the right hand side is positive for a particular gas at a particular temperature and pressure, the gas will exhibit the Joule-Thomson effect under those conditions. Nitrogen will exhibit the Joule-Thomson effect between the temperatures of −156 and 277° C. Nitrogen can therefore be used in the invention. Carbon dioxide, and in some cases air, can also be used.

While the fluid may condense as it cools, this may or may not be an advantage depending on the physical configuration of the system. Cooling through condensation is very rapid and provides a comparatively constant temperature in the cooling medium. However, cooling by condensation may be too rapid and result in excessive temperature gradients within the substrates. Therefore, it is advantageous to use a fluid that has a relatively high thermal inertia but does not liquify or form a two phase system upon venting into the chamber. Supercritical carbon dioxide can be used to achieve rapid cooling without phase changes.

Fluid from reservoir 10 vents into chamber 180 through inlet valve 140. Inlet valve 140 may be any type of valve that allows a reasonably controlled rate of flow over a range of settings. For example, it may be a ball valve, a globe valve, or a needle valve. A needle valve can be used to achieve precise flow control.

Venting fluid into chamber 180 and exhausting it through valve 200 causes convection within chamber 180, but it may be beneficial to increase convection within chamber 180, using a fan 160 for example. Increasing convection within chamber 180 increases heat transfer between the cooling fluid and substrates 190. Thereby, the rate of cooling is increased. If convection within chamber 180 is increased without increasing the rate of flow through chamber 180, uniformity of temperature within the cooling fluid increases, making the cooling process more uniform as well.

Fluid is released from chamber 180 through exhaust valve 220. Like inlet valve 140, exhaust valve 220 may be any type of valve that allows a reasonably controlled rate of flow over a range of settings. For example, it may be a ball valve, a globe valve, or a needle valve. Exhaust valve 220, and inlet valve 140, may provide controller 150 with an indications of their position, e.g., whether and to what extent they are open.

Inlet valve 140 and outlet valve 220 can be adjusted independently to separately control the flow rate of cooling fluid through chamber 180 and the pressure drop across inlet valve 140. The pressure drop 140 affects the temperature of the cooling fluid as it enters chamber 180. Therefore, inlet valve 140 and outlet valve 220 can be used to independently control two parameters, such as the temperature of the cooling fluid as it enters chamber 180 and the flow rate of cooling fluid through chamber 180.

Temperature sensors 250, 260, 270, and 280 table suitable type for the temperatures and media (fluid or solid) that are being measured. For example, they may be thermocouples, thermistors, resistance temperature detectors, or radiation thermometers. Preferably, temperature sensor 250 senses the temperature of substrates 290 without touching or contaminating them. A sensor based on reflected radiation may be used. For example, temperature sensor 250 may be an interferometer detecting thermal expansion or a spectrophotometer detecting changes in fluorescence or color. Temperature sensor 250 samples the substrate temperature at one point. However, multiple sensors giving an average temperature can also be used. Alternatively, sensor 250 may measure the temperature of an object that has a temperature approximating that of the substrate. For example, temperature sensor 250 may sense the temperature of hot plate 210.

Pressure sensors 130 and 170 and flow meter 230 may be of conventional types. Flow meter 230 may be, for example, a thermal dispersion mass flow meter, a differential pressure flow meter, a positive displacement flow meter, or a Coriolis mass flow meter.

In a method of the invention, fluid from reservoir 110 is vented into chamber 180 at a controlled rate and temperature. The rate and temperature may be set by controller 150 thorough manipulation of inlet valve 140 and outlet valve 220.

The rate at which the substrates are cooled, $q_S$, may be represented by the following equation:

$$q_S = H_S(T_S - T_C)$$

where $H_S$ is an overall heat transfer coefficient, $T_S$ is the substrate temperature, and $T_C$ is the average temperature of the fluid in the chamber. The heat taken up by the substrates must equal the heat released by the flowing fluid. Assuming that the fluid leaving the chamber is at the average temperature for fluid in the chamber:

$$q_S = F\ C_V(T_C - T_i)$$

where F is the volumetric flow rate of cooling fluid, $C_V$ is the fluid's heat capacity on a unit volume basis, and $T_i$ is the temperature of the fluid entering the chamber. Solving for the average chamber temperature:

$$T_C = (H_S T_S - F\ C_V T_i)/(H_S + F\ C_V)$$

When the heat transfer coefficient is very high in comparison with the flow rate, the average temperature of the fluid in the chamber approaches the substrate temperature. When the flow rate is high compared to the heat transfer coefficient, the average temperature of the fluid in the chamber approaches the temperature of the fluid entering the chamber.

Uniform cooling of the substrate may be facilitated by keeping the average temperature of fluid in the chamber comparatively close to the substrate temperature. This slows the cooling rate, allowing time for heat to disperse evenly. Reducing the temperature difference between the fluid in the chamber and the substrates may also reduce the size of temperature differences within the cooling fluid near the substrates. To realize this latter benefit, it is preferable that cooling fluid entering the chamber does not contact the substrates immediately. Rather, it is advantageous if the entering fluid flow is directed against a wall or a baffle 290, whereby the cooling fluid entering the chamber substantially mixes with the fluid already in the chamber before contacting the substrates.

Uniform cooling may also be facilitated by having the degree of re-circulation or mixing within the chamber high relative to the flow rate through the chamber. The ratio of re-circulation to that of flow through may be increased by reducing the flow rate, particularly when a fan or other device forces convection within the chamber.

Rapid cooling may be facilitated by increasing the temperature difference between the chamber fluid and the substrates. The temperature difference may be increased by increasing the flow rate of cooling fluid and/or reducing the temperature of the fluid entering the chamber.

A balance between cooling rate and cooling uniformity may need to be struck. The location of that balance and the control strategy used to obtain it depends on the demands of the particular application and the physical configuration of the chamber and the substrates. The control strategy may be implemented by controller 150. Controller 150 is a logic circuit, such as a programmable logic circuit. Typically, controller 150 includes a microprocessor and a memory containing suitable software instructions.

Figure 2:
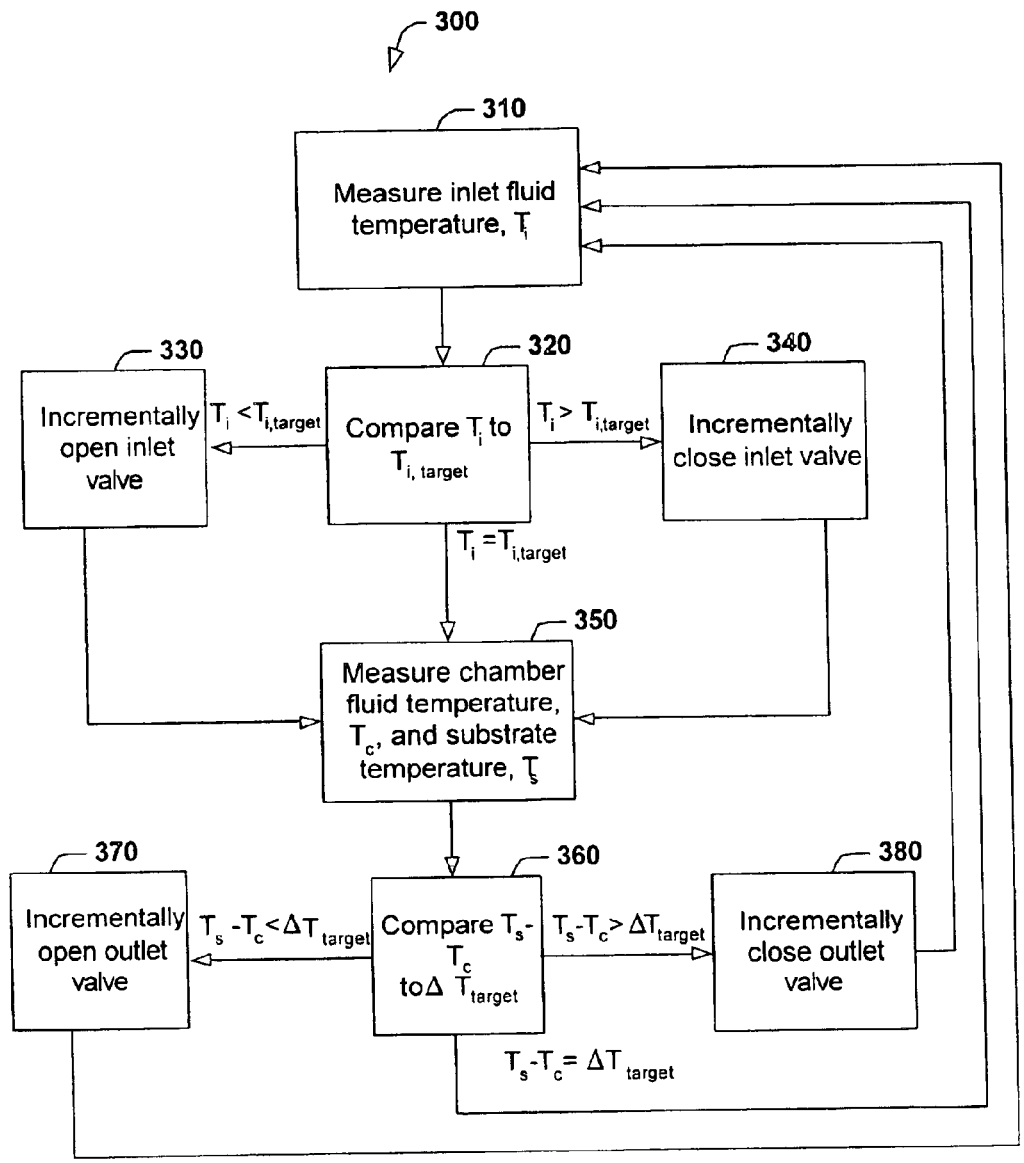
FIG. 2 is a flow diagram of a control strategy for use with a process of the present invention.

A control strategy 300, which may be effective in obtaining uniform cooling, is illustrated in FIG. 2. Strategy 300 seeks a constant cooling fluid temperature at the inlet and a fixed temperature difference between the substrate and the average cooling fluid in chamber 190. An advantage of this strategy is that is conserves the use of cooling fluid from high pressure reservoir 110. In step 310. The inlet fluid temperature is measured by sensor 270. In step 320, controller 150 compares the inlet fluid temperature to the target value. If the inlet fluid temperature is greater than the target value, inlet valve 140 is incrementally closed in step 340. Incrementally closing inlet valve 140 tends to decrease the chamber pressure, increase the pressure drop across inlet valve 140, and decrease the inlet gas temperature. If the inlet fluid temperature is less than the target value, inlet valve 140 is incrementally opened in step 330. Incrementally opening inlet valve 140 tends to increase the chamber pressure, decrease the pressure drop across inlet valve 140, and increase the inlet gas temperature.

In step 350, the substrate temperature is measured by sensor 250 and the average chamber fluid temperature is measured (approximately) by sensor 280. Controller 150 compares the difference between these two temperatures to a target difference in step 360. If the temperature difference is greater than the target, outlet valve 220 is incrementally closed in step 380. Incrementally closing outlet valve 220 decreases the flow rate through the chamber, which tends to decrease the temperature difference between the fluid in the chamber and the substrate. If the temperature difference is less than the target, outlet valve 220 is incrementally opened in step 370. Incrementally opening outlet valve 220 increases the flow rate through the chamber, which tends to increase the temperature difference between the fluid in the chamber and the substrate. The steps, beginning again with step 310, are repeated.

Strategy 300 may be improved by simultaneously adjusting both the inlet and outlet valves taking into account the results of both comparisons. While strategy 300 uses inlet valve 140 to adjust the inlet fluid temperature and outlet valve 220 to adjust the temperature difference, adjustments to inlet valve 140 affect the temperature difference and adjustments to outlet valve 220 affect the inlet fluid temperature. Using a mathematical model, these cross-correlations could be taken into account and both valves adjusted simultaneously. These and other possible improvements in this and other control strategies discussed herein will be readily apparent to one of ordinary skill in the art.

Figure 3:
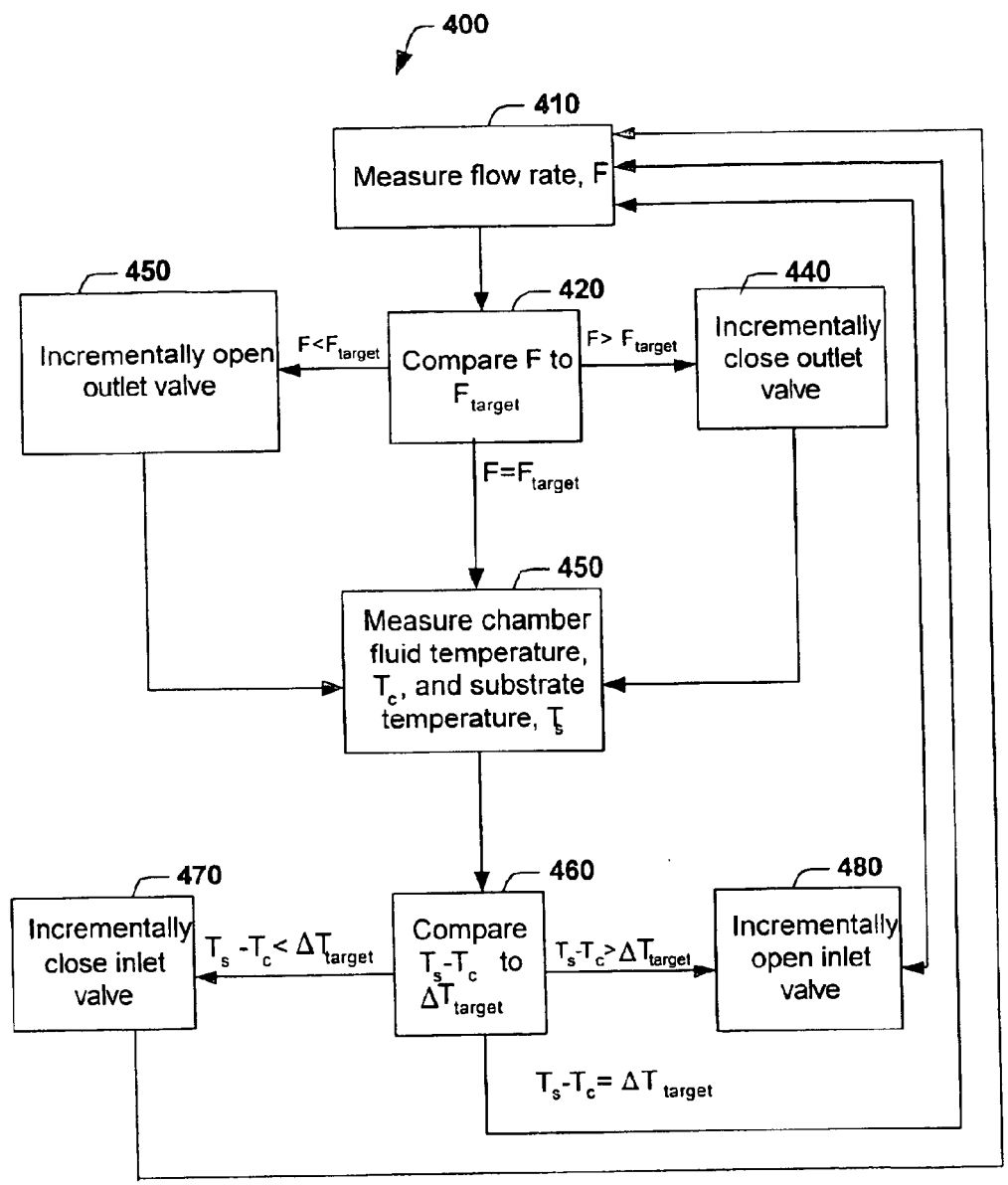
FIG. 3 is a flow diagram of another control strategy for use with a process of the present invention.

Another control strategy 400 that may be effective in obtaining a uniform rate of cooling is illustrated in FIG. 3. Strategy 400 uses a constant flow rate throughout the cooling process and also maintains a fixed temperature difference between the substrate and the cooling fluid in chamber 190. Keeping the flow rate low in comparison to the re-circulation or mixing rate within chamber 190 is particularly effective in obtaining uniform cooling rates. In step 410, the flow rate is measured by flow meter 230. In step 420, controller 150 compares the flow rate to the target value. If the flow rate is greater than the target value, outlet valve 220 is incrementally closed in step 440. If the flow rate is less than the target value, outlet valve 220 is incrementally opened in step 430.

In step 450, the substrate temperature is measured by sensor 250 and the average chamber fluid temperature is measured (approximately) by sensor 280. Controller 150 compares the difference between these two temperatures to a target difference in step 460. If the temperature difference is greater than the target, inlet valve 140 is incrementally opened in step 480. Incrementally opening inlet valve 140 while keeping the flow rate constant, through adjustments to outlet valve 220, increases the pressure in the chamber, decreases the pressure drop across inlet valve 140, and increases the temperature of the cooling fluid. If the temperature difference is less than the target, inlet valve 140 is incrementally closed in step 470. Incrementally closing inlet valve 140 while keeping the flow rate constant, through adjustments to outlet valve 220, decreases the pressure in the chamber, increases the pressure drop across inlet valve 140, and decreases the temperature of the cooling fluid.

Control strategy 400 demonstrates that it may be desirable to heat the fluid in reservoir 110 while it is in the reservoir or as it flow from reservoir 110 to chamber 190. Ordinarily, adjusting the pressure drop across inlet valve 140 permits the inlet fluid temperature to be adjusted only in the range at or below the reservoir temperature. In a constant flow rate process, heating the cooling fluid may be desirable to reduce the temperature difference between the cooling fluid and the substrate to a target level, particularly during the early stages of the cooling process when the substrate may be comparatively hot.

Control strategies 300 and 400 are over simplified in that they show the valves being incrementally opened or closed at every step whenever there is a difference between a measured value and its target. Control strategies are generally more complex, involving for example, proportional, integral and differential control. The strategy used depends on the dynamics of the system being controlled, but is selected to keep response times short and limit problems such as oscillation and overshoot.

While control strategies 300 and 400 both maintain an approximately constant overall cooling rate, it may be desirable to vary the cooling rate. During the early stages of the cooling process when the substrates are hotter, temperature variations in the substrates have greater effects. During the later stages of the cooling process, temperature differences may be less important and more rapid cooling may be permissible. Therefore, it may be desirable to increase the target temperature difference between the substrate and the fluid in the chamber as substrate temperature decreases.

In some situations the effect of temperature variations in the substrates may be mitigated by rapid overall cooling. For example, if the only effect of a temperature variation on a particular substrate is a difference in solvent evaporation rate, the effect will be mitigated if the entire substrate cools before significant evaporation takes place. In such circumstances, the control objective may be to maintain a low cooling fluid temperature in the chamber. This may be accomplished by opening outlet valve 220 to a large extent so that the chamber pressure is nearly atmospheric and the flow rate of cooling fluid through the chamber is high.

The forgoing discussion of control strategies has been premised, to some extent, on the assumption that the overall heat transfer coefficient between the chamber gas and the substrates and the uniformity of heat transfer between the chamber gas and the substrates are not substantially affected by the pressure in the chamber or the flow rate of cooling fluid through the chamber. While these assumptions are valid in many circumstances, there are other circumstances where they become significant considerations. For example, when re-circulation within the chamber is low in comparison with the flow rate through the chamber, there may be significant variations in the cooling fluid temperature, which may result in nonuniform cooling of the substrates.

A control strategy aimed at maintaining an elevated pressure within the chamber may increase uniformity of cooling. Increasing the chamber pressure at constant mass flow rate through the chamber increases the residence time and thermal inertia of the fluid within the chamber. Higher thermal inertia and higher residence time will generally result in more uniform cooling. In one embodiment of the invention, the pressure in the chamber is maintained at or above about 2 bar. In another embodiment, the pressure in the chamber is maintained at or above about 10 bar. In a further embodiment, the pressure in the chamber is maintained at or above about 20 bar.

Figure 4:
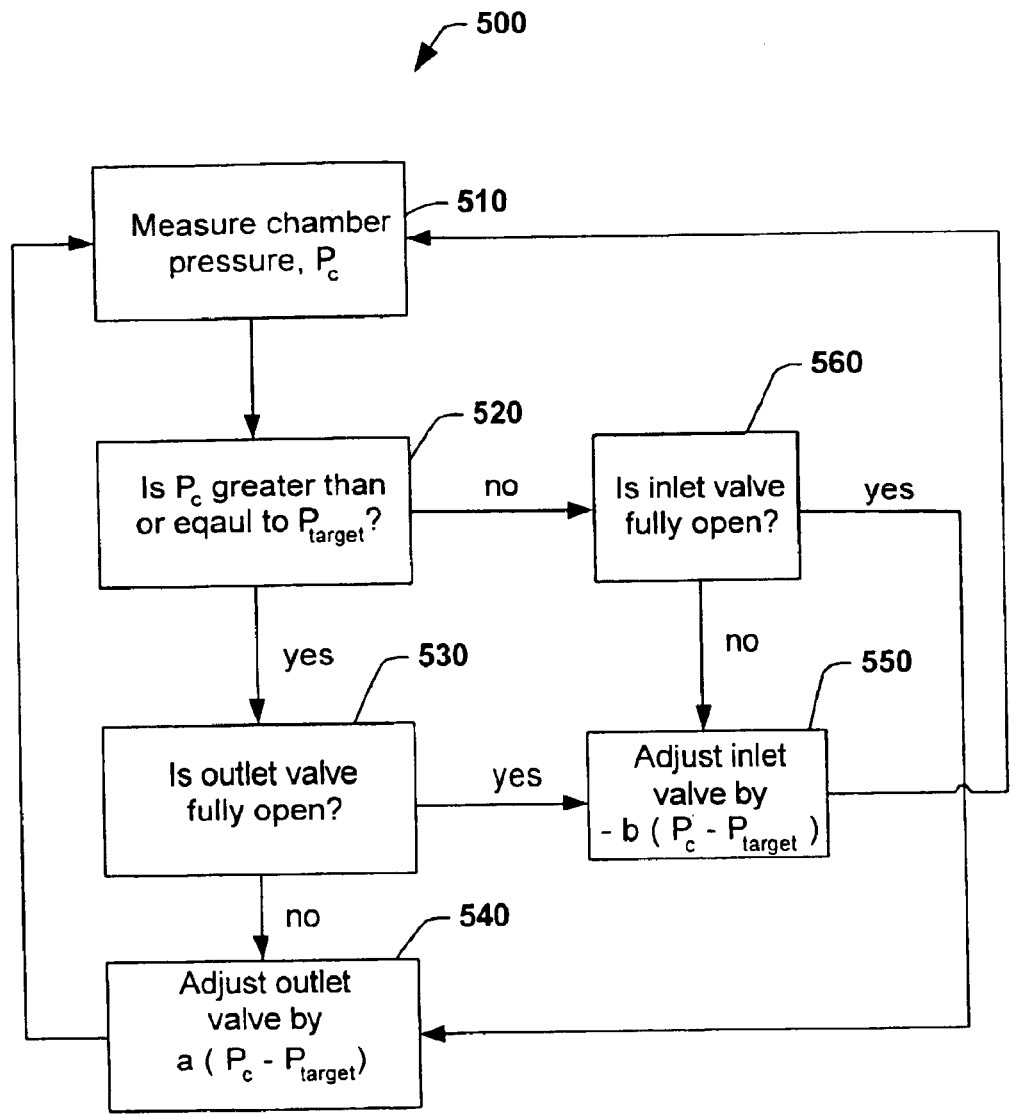
FIG. 4 is a flow diagram of still another a control strategy for use with a process of the present invention.

FIG. 4 illustrates a control strategy 500 for maintaining a high flow rate through the chamber and a constant pressure within the chamber. The target pressure may be, for example, the pressure necessary to maintain $CO_2$ in a supercritical state. In step 510, the chamber pressure is measured by meter 170. In step 520, controller 150 compares the measured chamber pressure to the target chamber pressure. If the measured chamber pressure is too high, controller 150 checks, in step 530, whether outlet valve 220 is fully open. If it is fully open, inlet valve 140 is closed in step 550 by a proportionality factor, b, times the pressure difference. If outlet valve 220 is not fully open, outlet valve 220 is opened in step 540 by a proportionality factor, a, times the pressure difference. Proportionality factors a and b are proportional control factors, which are selected by the user based on experience with the valves and the system dynamics.

If in step 520 the measure chamber pressure is less than or equal to the target pressure, control proceeds to step 560 wherein controller 150 checks whether inlet valve 140 is fully open. If it is fully open, outlet valve 220 is closed in step 540 by a proportionality factor, a, times the pressure difference. If outlet valve 220 is not fully open, inlet valve 140 is opened in step 550 by a proportionality factor, b, times the pressure difference. Steps 540 and 550 return control to step 510, so the process of measurement, comparison, and adjustment repeats. Differential and integral control can be added to strategy 500 (and strategies 300 and 400) if needed, to improve the control system's stability and responsiveness.

The methods of the invention may be used to limit the variation in temperature within and among substrates during cooling. In one embodiment, the temperature never varies by more then about 5° C. among and within the substrates 190. In another embodiment, the temperature never varies by more then about 2° C. among and within the substrates 190. In a further embodiment, the temperature never varies by more then about 0.5° C. among and within the substrates 190.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for cooling coated semiconductor substrates, said system comprising:

a chamber for receiving at least one coated semiconductor substrate;

a high pressure fluid reservoir that vents cooling fluid into the chamber;

a coupling coupled to the chamber and the high pressure fluid reservoir for placing the chamber in fluid communication with the high pressure fluid reservoir, the coupling comprising a filter to exclude contaminate particles from the fluid;

an inlet valve attached to the coupling for controlling a flow of cooling fluid between the high pressure fluid reservoir and the chamber, wherein the pressure drop across the inlet valve affects the cooling fluid temperature and is at least about 10 bar depending on independent adjustments made to the inlet valve and outlet valve;

a controller coupled to the inlet valve that selectively controls the inlet valve to optimize the pressure drop across the inlet valve separately and apart from the outlet valve by ma adjustments to each independently of the other based on calculated temperature readings of the respective valves.

2. The system of claim 1 wherein the pressure drop across the inlet valve is at last about 100 bar.

3. The system of claim 1 wherein the controller controls the temperature of the cooling fluid at a point within the chamber.

4. The system of claim 1 further comprising an outlet valve that releases at least a portion of the cooling fluid from the chamber as determined by the controller, wherein the controller incrementally opens or closes at least one of the inlet valve and the outlet valve to facilitate optimizing increased uniform cooling of the substrate.

5. The system of claim 1 wherein the controller controls the rate of cooling fluid flow through the chamber and temperature of the cooling fluid as it enters the chamber to obtain an optimal pressure drop as the fluid enters the chamber.

6. The system of claim 1 wherein cooling fluid entering the chamber from the reservoir substantially mixes with fluid already in the chamber before contacting the at least one semiconductor substrate.

7. The system of claim 6 further comprising a baffle that is positioned with resect to the cooling fluid flow, wherein the cooling fluid flowing into the chamber is directed against the baffle before making contact with the substrate.

8. A cooling system for coated semiconductor substrates comprising:

means for receiving at least one coated semiconductor substrate;

means for venting cooling fluid into the chamber;

means for coupling the chamber and the high pressure fluid reservoir to place the chamber in fluid communication with the high pressure fluid reservoir, the means for coupling comprising a means for excluding contaminate particles from the fluid;

in-flow means for selectively controlling an in-flow of cooling fluid between the high pressure fluid reservoir and the chamber, wherein the pressure drop across the in-flow means affects the cooling fluid temperature and is at least about 10 bar depending on independent adjustments made to the inlet valve and an out-flow means;

controlling means that controls the in-flow means to optimize the pressure drop across the in-flow means separately and apart from the out-flow means by making adjustments to each independently of the other based on calculated temperature readings of the respective valves.

9. The system of claim 8, wherein the out-flow means releases at least a portion of the cooling fluid from the chamber as determined by the controlling means, wherein the controlling means incrementally opens or closes at least one of the in-flow means and the out-flow means to facilitate optimizing increased uniform cooling of the substrate.

10. The system of claim 8 wherein the controlling means controls the rate of cooling fluid flow through the chamber and temperature of the cooling fluid as it enters the chamber to obtain an optimal pressure drop as the fluid enters the chamber.

* * * * *

UNITED STATES PATENT AND TRADEMARK OFFICE
CERTIFICATE OF CORRECTION

PATENT NO. : 6,889,763 B1
DATED : May 10, 2005
INVENTOR(S) : Ramkumar Subramanian et al.

It is certified that error appears in the above-identified patent and that said Letters Patent is hereby corrected as shown below:

Column 5,
Line 38, please change the reference number from "10" to -- 110 --.

Column 10,
Line 24, please change the word from "ma" to -- making --.

Signed and Sealed this

Sixteenth Day of August, 2005

JON W. DUDAS
*Director of the United States Patent and Trademark Office*